United States Patent [19]

Kinugasa et al.

[11] Patent Number: 4,821,084
[45] Date of Patent: Apr. 11, 1989

[54] INSULATED GATE TYPE FIELD EFFECT TRANSISTOR

[75] Inventors: Masanori Kinugasa, Yokohama; Fuminari Tanaka, Tokyo; Hiroshi Shigehara; Hirokata Ohta, both of Yokohama, all of Japan

[73] Assignee: Kabushiki Kaisha Toshiba, Kawasaki, Japan

[21] Appl. No.: 5,668

[22] Filed: Jan. 21, 1987

[30] Foreign Application Priority Data

Feb. 10, 1986 [JP] Japan ................................ 61-27431

[51] Int. Cl.⁴ .......................................... H01L 27/10
[52] U.S. Cl. .................................... 357/45; 357/23.1; 357/23.14; 357/68; 357/41
[58] Field of Search ............... 357/45, 41, 68, 23.1, 357/23.14

[56] References Cited

U.S. PATENT DOCUMENTS 4,015,278 3/1977 Fukuta.
4,152,714 5/1979 Hendrickson et al.
4,603,341 7/1986 Bertin et al. ............................ 357/45
4,636,825 1/1987 Baynes ............................ 357/23.14

FOREIGN PATENT DOCUMENTS 0092667 5/1985 Japan ...................................... 357/45
0145655 8/1985 Japan ...................................... 357/45
60-241257 11/1985 Japan ...................................... 357/45

OTHER PUBLICATIONS

Patent Abstracts of Japan, vol. 9, No. 181, 26th Jul. 1985, JP-A-60 53 085.

Primary Examiner—Martin H. Edlow
Attorney, Agent, or Firm—Finnegan, Henderson, Farabow, Garrett, & Dunner

[57] ABSTRACT

Extension directions of source electrode layer and a drain electrode are parallel to rows or columns of an array of alternately arranged source regions and drain regions, thereby forming widths of source and drain electrode layers wider than those of a conventional transistor to obtain a large mutual conductance.

5 Claims, 7 Drawing Sheets

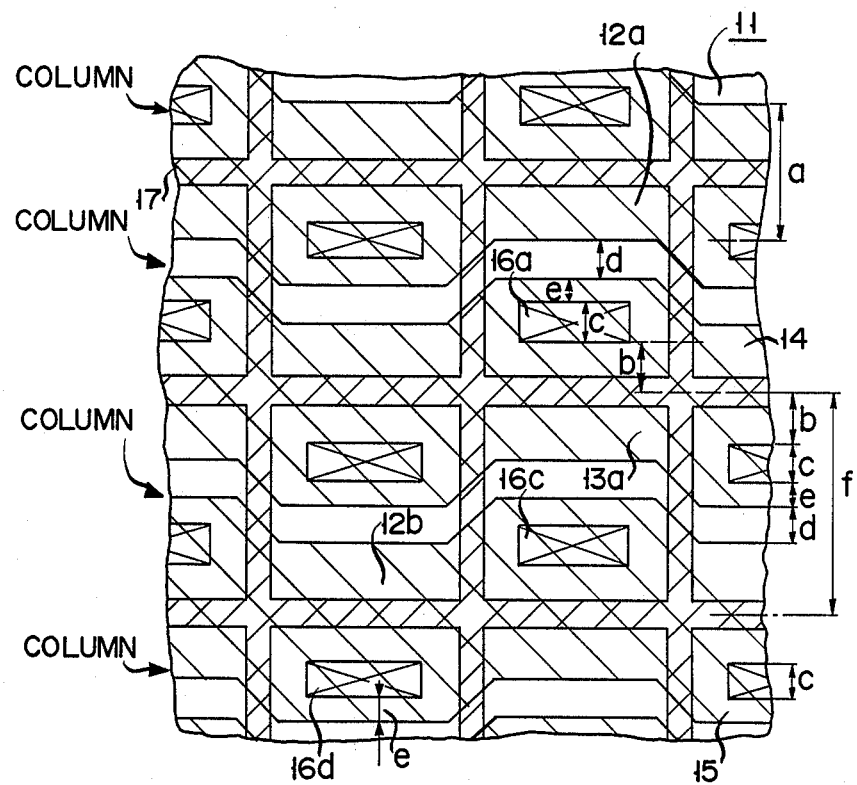

INSULATED GATE TYPE FIELD EFFECT TRANSISTOR

BACKGROUND OF THE INVENTION

The present invention relates to an insulated gate type field effect transistor and, more particularly, to an insulated gate type field effect transistor having a large mutual conductance and used for an IC output buffer.

An example of a conventional insulated gate type field effect transistor is shown in FIG. 1. (Japanese Patent Publication No. 46-1058). The transistor comprises semiconductor substrate 1 and a plurality of source regions 2 and drain regions 3 formed in a surface region of substrate 1 in a matrix pattern to form an array. Four regions adjacent to each of source regions 2 are all drain regions 3, and four regions adjacent to each of drain regions 3 are all source regions 2. Therefore, when viewed in a direction of rows or columns of the array, regions 2 and 3 are alternately arranged. Source electrode layer 4 of Al (aluminium) formed on source regions 2 and drain electrode layer 5 of Al formed on drain regions 3 are arranged in such a manner that the extension directions of source and drain electrode layers 4 and 5 are diagonal with respect to a direction of the rows or columns of alternately arranged regions 2 and 3. In order to increase the mutual conductance gm of the transistor, the widths of electrode layers 4 and 5 must be maximized in terms of an allowable current of the electrode layers 4 and 5.

In the transistor, however, since electrode layers 4 and 5 are arranged diagonally to the rows or columns of alternately arranged regions 2 and 3, the widths of the source and drain electrode layers are reduced.

Another conventional insulated gate type field effect transistor as shown in FIG. 2 has been known. In this transistor, the configuration of contact holes 6 allowing communicating between the source and drain regions 2 and 3 and the wiring layer is a rectangle having long sides along a diagonal direction, thereby enlarging the contact area of source region 2 and source electrode layer 4 and the contact area of drain region 3 and drain electrode layer 5 so that contact resistances are reduced. However, in the transistor shown in FIG. 2, since electrodes layers 4 and 5 are arranged in a diagonal direction, the widths of the electrode layers cannot be formed sufficiently wide.

A further conventional insulated gate type field effect transistor shown in FIG. 3 has been known (Japanese Patent Disclosure (Kokai) No. 60-53085). In this transistor, the shape of contact holes 7 is a hexagon having two long sides along electrode layers 4 and 5, thereby reducing the contact resistances of source and drain regions 2 and 3 compared to that of the transistor shown in FIG. 2. However, also in this transistor, since electrode layers 4 and 5 are arranged in a diagonal direction, the electrode layers cannot be formed sufficiently wide.

SUMMARY OF THE INVENTION

The present invention has been made in consideration of the above situation, and has as its object to provide an insulated gate type field effect transistor wherein source and drain electrode layers are formed wider than those of a conventional transistor, thereby obtaining a large mutual conductance.

In the present invention, extension directions of the source and drain electrode layers are parallel to the rows or columns of the array of alternately arranged source and drain regions, thereby forming the source and drain electrode layer wider than those of a conventional transistor, to obtain a large mutual conductance.

According to the present invention, there is provided an insulated gate type field effect transistor comprising: a semiconductor substrate; source regions and drain regions formed on a surface region of the substrate in a matrix pattern, the drain regions being positioned at four sides of any of the source regions and the source regions being positioned at four sides of any of the drain regions, so that the source and drain regions are alternately arranged to form an array comprising rows and columns of the source and drain regions; a source electrode layer connected to the source regions; and a drain electrode connected to the drain regions, wherein extension directions of the source and drain electrode layers are parallel to one of the rows and columns of alternately arranged source and drain regions.

BRIEF DESCRIPTION OF THE DRAWINGS

FIGS. 8 and 9 show patterns of modifications of the patterns in FIGS. 4 and 7, respectively.

DETAILED DESCRIPTION OF THE PREFERRED EMBODIMENTS

Figure 4:
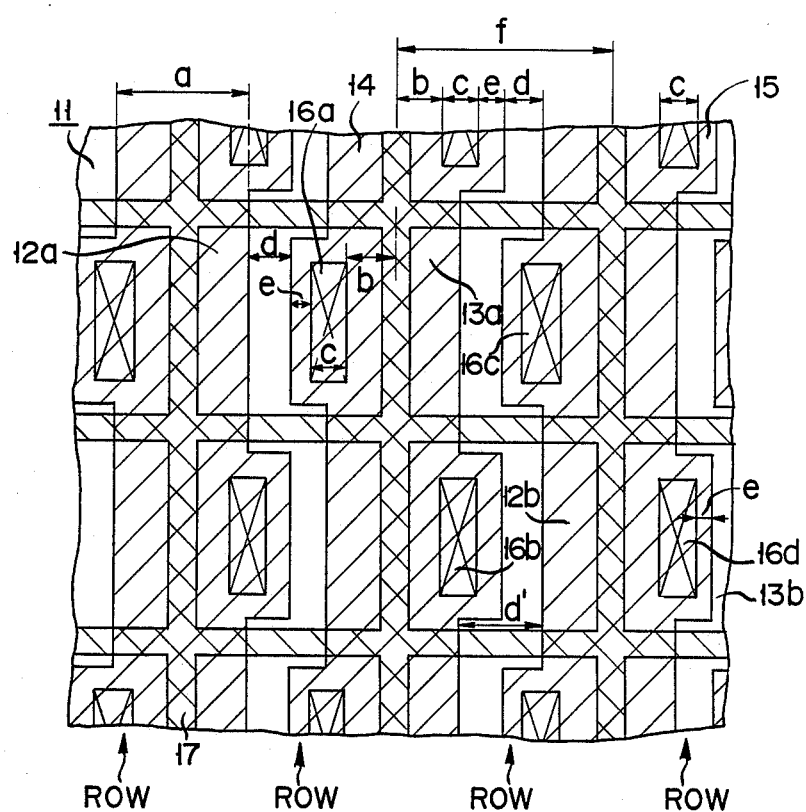
FIG. 4 shows a pattern of an insulated gate type field effect transistor according to an embodiment of the present invention.
Figure 5:
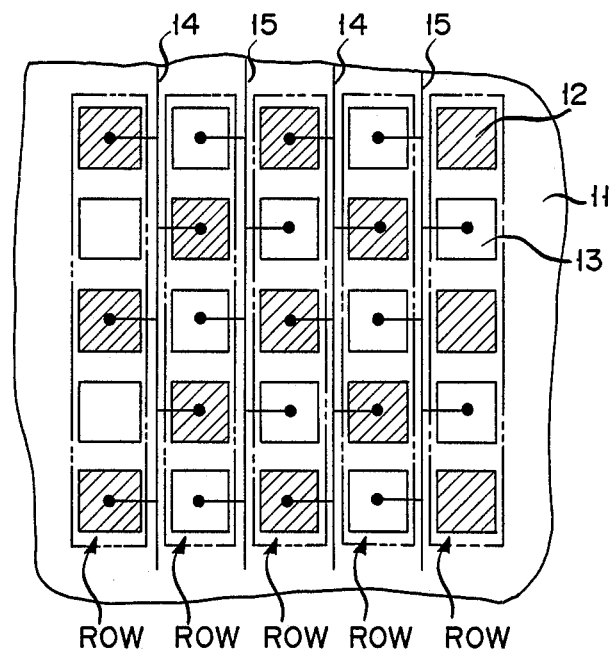
FIGS. 5 and 6 are schematic views of the pattern in FIG. 4.
Figure 6:
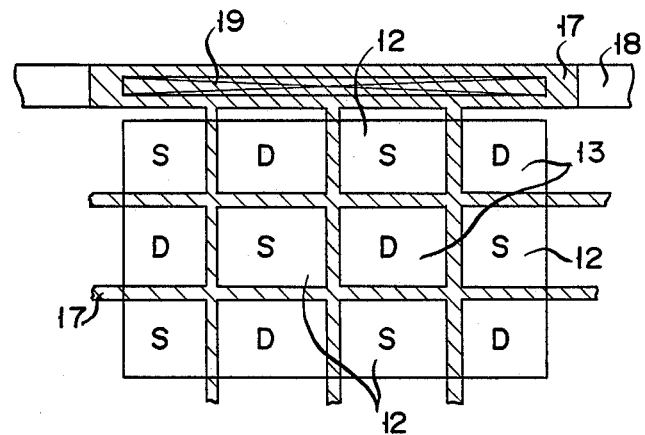

Embodiments of the present invention will now be described in detail with reference to the accompanying drawings. FIG. 4 shows a pattern of an essential part of an insulated gate type field effect transistor according to a first embodiment of the present invention, and FIGS. 5 and 6 are schematic views of the pattern of the transistor in FIG. 4.

In a major surface region of p-type silicon substrate 11, n+-type source regions 12 (including 12a and 12b) and n+-type drain regions 13 (including 13a and 13b) are arranged in a matrix mode to form an array of rows and columns of the source and drain regions. Four regions adjacent to any source region 12 are all drain regions 13. Similarly, four regions adjacent to any drain region 13 are all source regions 12. Therefore, drain regions 13 are positioned at four sides of source regions 12, and source regions 12 are positioned at four sides of drain regions 13. Source electrode layer 14 made of Al (aluminium) or the like is provided to source regions 12, and drain electrode layer 15 made of Al or the like is provided to drain regions 13. Drain and source regions 12 and 13 are connected to drain and source electrode layers 14 and 15, respectively, through contact holes 16 (including 16a to 16d). Electrode layers 14 and 15 are alternately arranged on substrate 11 in parallel to the rows of alternately arranged regions 12 and 13. Extension directions of electrode layers 14 and 15 are respectively parallel to the rows.

A pattern of electrode layers 14 and 15 is shown in FIG. 4. More specifically, for example, source electrode layer 14 is connected to source region 12a of one adjacent row, source region 12b of another adjacent row, . . . , through contact holes 16a, 16b, . . . , respectively. Electrode layer 14 extends with a sharp configuration (to the left in FIG. 4) on region 12a and covers hole 16a. Electrode layer 14 also extends with a sharp configuration (to the right in FIG. 4) on region 12b and covers hole 16b. In other words, electrode layer 14 extends to the right and left alternately along its extension direction. Similarly drain electrode layer 15 extends with a sharp configuration (to the left in FIG. 4) on drain region 13a and covers contact hole 16c. Electrode 15 also extends with a sharp configuration (to the right in FIG. 4) on drain region 13b and covers contact hole 16d. In other words, electrode layer 15 extends to the right and left alternately along its extension direction. Reference numeral 17 denotes a gate electrode made of, e.g., a polysilicon, which is formed to surround regions 12 and 13. Reference numeral 18 denotes a signal line made of, for example, Al (aluminium), which is in contact with electrode 17 through contact hole 19 (FIG. 6).

In this embodiment, electrode layers 14 and 15 are formed so that their extension directions are parallel to rows of alternately arranged regions 12 and 13. Therefore, when a pattern pitch of gate electrode layers is set equal to that of a conventional transistor, the source and drain electrode layers can be formed wider than those of a conventional transistor. This will be described in detail below.

Figure 1:
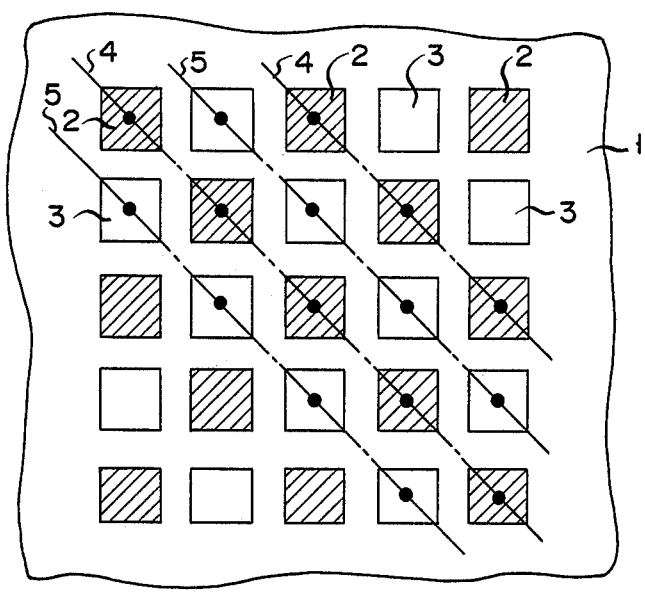
FIG. 1 shows a pattern of a conventional insulated gate type field effect transistor.
Figure 2:
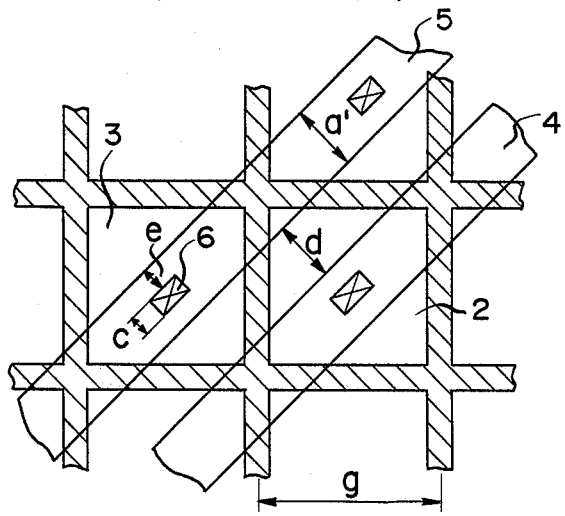
FIG. 2 shows a pattern of another conventional insulated gate type field effect transistor.
Figure 3:
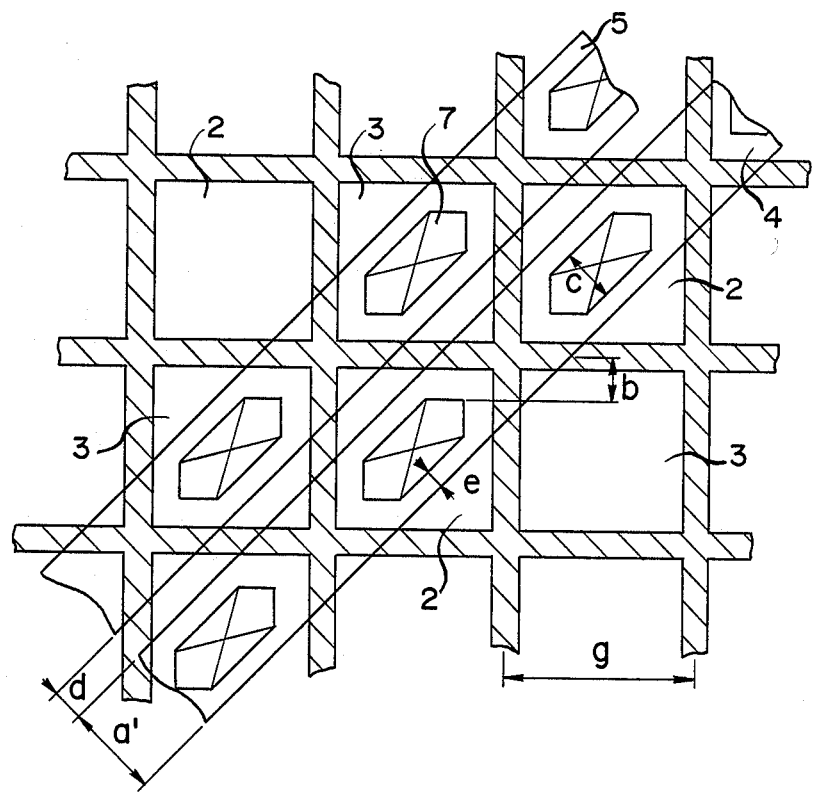
FIG. 3 shows a pattern of still another conventional insulated gate type field effect transistor.

Reference character a in the embodiment of FIG. 4 and reference character a' in the conventional examples of FIGS. 2 and 3, denote a width of drain or source electrode layer 14 or 15 (to be referred to as a source or drain electrode layer width); b, a distance between a central axis of gate electrode 17 and an adjacent edge of hole 16; c, a contact hole width; d, a minimum distance between source and drain electrode layers; e, a distance between an edge of a source or drain electrode layer and an adjacent edge of hole 16; and f in FIG. 4 and 5 in FIGS. 2 and 3, a pattern pitch of gate electrode layers (i.e., a pattern pitch of a source or drain electrode layer).

Width a' of the conventional examples is given by the following inequality:

$$a' \leq \frac{1}{\sqrt{2}} g - d \quad (1)$$

Width a of the embodiment shown in FIG. 4 is derived from the following inequality:

$$2f \geq a + d + e + c + b + b + c + e + d \quad (2)$$
$$= a + (b + c + d + e)$$

therefore, $$a \leq 2(f - b - c - d - e) \quad (3)$$

Assume now that f=g. Under the assumption, if an inequality of a>a' is satisfied, it proves that the widths of the source and drain electrode layers in the embodiment of FIG. 4 are wider than those in the prior art examples of FIGS. 2 and 3.

Here, assuming that b=8 μm, c=6 μm, d=6 μm, e=4 μm, and f and g=35 μm.

Electrode layer width a' in the pattern of the conventional examples, is given by:

$$a' = (1/\sqrt{2})35 - 6 = 18.7 \ \mu m.$$

While, electrode layer width a in the pattern of the above-mentioned embodiment is given by:

$$a = 2(35 - 8 - 6 - 4) = 22 \ \mu m$$

Now we have understood that a >a' was satisfied. As proved, the source and drain electrode layers according to the embodiment of the present invention are wider than those of the conventional examples. Therefore, an allowable current capacity of the pattern of the above-mentioned embodiment is larger than that of the conventional examples, and the pattern of the embodiment is more effective than that of the conventional examples, when using a pattern for a transistor of an output buffer.

Widths a of the source and drain-electrode layers of the embodiment in FIG. 4 can be rewritten by the following equation:

$$a = f(=g) - d' \quad (4)$$

where d' is the maximum distance between electrode layers 14 and 15.

Equations (1) and (4) yield the condition to satisfy $a - a' > 0$ as follows:

$$a - a' = g - d' - \frac{1}{\sqrt{2}} g + d > 0 \quad (5)$$

therefore, $$d' < \frac{2 - \sqrt{2}}{2} g + d \quad (6)$$

When a circuit is designed to satisfy inequality (6), the source or drain electrode layers can be set wider than those of the conventional examples.

Figure 7:
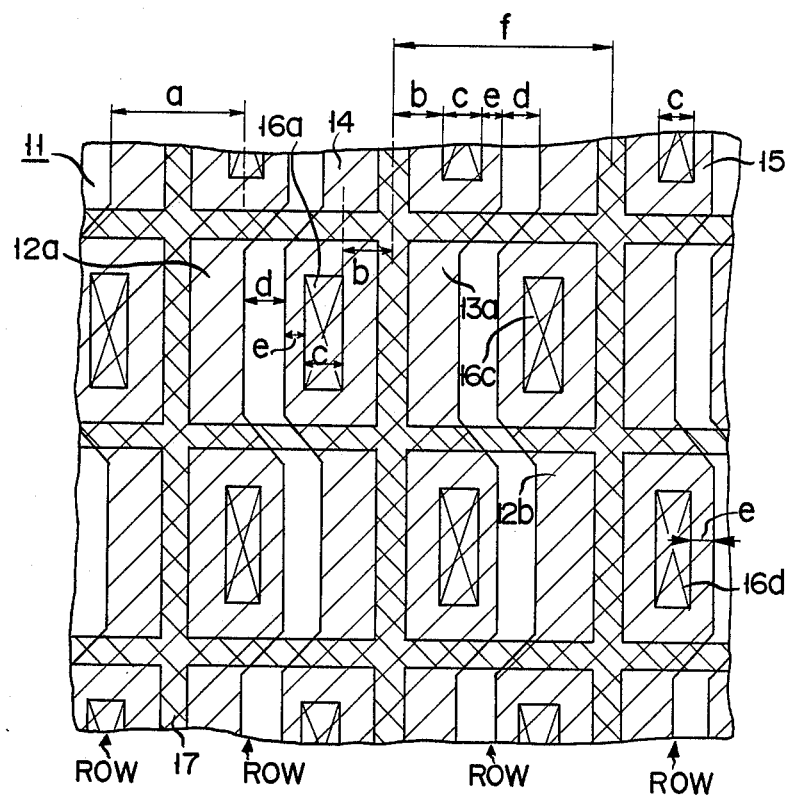
FIG. 7 shows a pattern of an insulated gate type field effect transistor according to another embodiment of the present invention.

Note that in the above-mentioned embodiment, the source and drain electrode layers have portions sharply extending on the source and drain regions, respectively, (substantially at a right angle in FIG. 4), but the present invention is not limited to this embodiment. For example, the extended portion may be dull, as shown in FIG. 7. The corresponding parts as in FIG. 4 are denoted by the same reference numerals in FIG. 7, and a detailed description thereof will be omitted.

In the above-mentioned embodiment, extension directions of source and drain electrode layer are set to be parallel to rows of alternately arranged source and drain regions, but the present invention is not limited to this embodiment.

Figure 8:
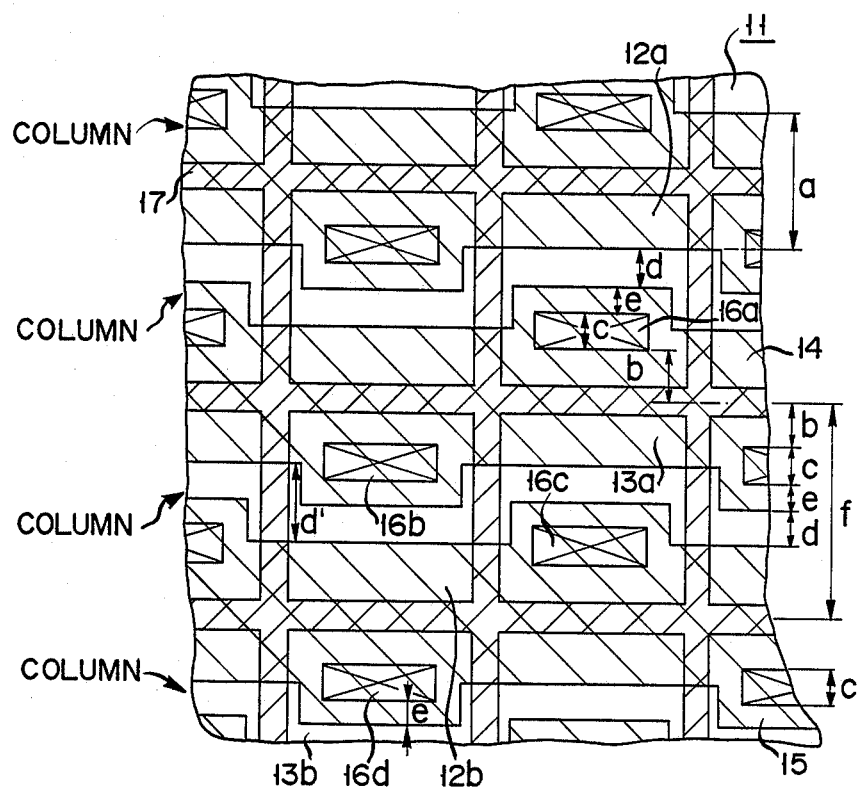

FIG. 8 shows a modification of the embodiment in FIG. 4 and FIG. 9 shows a modification of the embodiment in FIG. 7. In the embodiments of FIGS. 8 and 9, the extension direction may be set to be parallel to columns of alternately arranged source and drain regions. The corresponding parts in FIGS. 8 and 9 are denoted by the same reference numerals as in FIGS. 4 and 7, and detailed descriptions thereof will be omitted. The embodiments in FIGS. 8 and 9 can achieve substantially the same effect as that obtained by the embodiments in FIGS. 4 and 7.

As has been described above, according to the present invention, there is provided an insulated gate type field effect transistor wherein extension directions of source and drain electrode layers can be arranged in parallel to rows or columns of alternately arranged source and drain regions, thereby forming widths of source and drain electrode layers wider than those of a conventional transistor to obtain a large mutual conductance.

What is claimed is:

1. An insulated gate type field effect transistor having a gate electrode layer formed in a mesh pattern, comprising:
    a semiconductor substrate;
    a gate electrode layer formed in a mesh pattern on portions of a surface region of said substrate;
    source regions and drain regions formed in said surface region portions of said substrate defined by the gate electrode layer formed in the mesh pattern, so that the source regions and drain regions are arrayed in a matrix pattern, said drain regions being positioned at four sides of any of said source regions and said source regions being positioned at four sides of any of said drain regions, so that said source and drain regions are alternately arranged to form an array comprising rows and columns of said source and drain regions;
    a source electrode layer connected to said source regions; and
    a drain electrode layer connected to said drain regions,
    wherein extension directions of said source and drain electrode layers are parallel to one of said rows and columns of said alternately arranged source and drain regions.

2. A transistor according to claim 1, wherein said extension directions of the source and drain electrode layers are parallel to said rows.

3. A transistor according to claim 1, wherein said extension directions of the source and drain electrode layers are parallel to said columns.

4. A transistor according to claim 1, wherein the following inequality:

$$d' < \frac{2 - \sqrt{2}}{2} g + d$$

is satisfied where d is a minimum distance between source and drain electrode layers; d', a maximum distance therebetween; and g, a pitch defined as a distance between the axes of those portions of said gate electrode layer, which are associated with adjacent transistors.

5. A transistor according to claim 1, wherein said source and drain electrode layers have portions extending on said source and drain regions to cover contact holes, respectively.

* * * * *